(12) United States Patent
Zhang

(10) Patent No.: US 6,946,915 B2
(45) Date of Patent: Sep. 20, 2005

(54) MAXIMALLY DIGITIZED FRACTIONAL-N FREQUENCY SYNTHESIZER AND MODULATOR WITH MAXIMAL FRACTIONAL SPURS REMOVING

(76) Inventor: Xiaopin Zhang, Moosacher Str. 81/602, 80809 Munich (DE)

(*) Notice: Subject to any disclaimer, the term of this patent is extended or adjusted under 35 U.S.C. 154(b) by 113 days.

(21) Appl. No.: 10/656,762

(22) Filed: Sep. 8, 2003

(65) Prior Publication Data

US 2004/0183601 A1 Sep. 23, 2004

Related U.S. Application Data

(60) Provisional application No. 60/454,545, filed on Mar. 17, 2003.

(51) Int. Cl.[7] ............................ H03L 7/085; H03L 7/10; H03L 7/16; H03C 3/00; H04L 27/12
(52) U.S. Cl. ............................ 331/1 A; 331/16; 331/17; 331/23; 331/25; 332/127; 332/128
(58) Field of Search ........................ 331/1 A, 16–18, 331/23, 25; 327/115, 117, 118, 156–159; 332/127, 128; 360/51; 375/376; 455/260

(56) References Cited

U.S. PATENT DOCUMENTS 4,933,890 A * 6/1990 Nuytkens et al. ........... 708/276

* cited by examiner

Primary Examiner—David Mis

(57) ABSTRACT

A fractional-N frequency synthesizer using the first order Delta-Sigma frequency discriminator which is composed of only a dual modulus frequency divider and a D flip-flop is used to replace the function of phase detector is disclosed. The invented structure is characterized by generating the feedback error signal indirectly from the output bit stream of said discriminator in such a way that the quantization noise contained in the bit stream is maximally canceled by comparing it with another bit stream generated by an accumulator digitally performing the first order Delta-Sigma modulation to the required fractional number, so that there is almost no discrete fractional spurs in the output spectrum of the synthesizer. Most other circuit of the synthesizer could be formed digitally so that high integration level and low noise performance could be achieved. Narrow or wideband phase or frequency modulation could also be conveniently added digitally with good accuracy.

18 Claims, 7 Drawing Sheets

MAXIMALLY DIGITIZED FRACTIONAL-N FREQUENCY SYNTHESIZER AND MODULATOR WITH MAXIMAL FRACTIONAL SPURS REMOVING

CROSS-REFERENCE TO RELATED APPLICATIONS

This application claims the benefit, under 35 U.S.C. 119(e), of U.S. Provisional Application No. 60/454,545, entitled Maximally Digitized Sigma-Delta RF Frequency Synthesizer and Frequency or Phase Modulator with Complete Fractional Spurious Removing, filed Mar. 17, 2003 by Xiaopin Zhang.

This application also claims the priority, under 35 U.S.C. 119(a), of European Patent Application No. 03012840.9, entitled Maximally Digitized Fractional-N Frequency Synthesizer and Modulator with Maximal Fractional Spurious Removing, filed Jun. 06, 2003 by Xiaopin Zhang.

STATEMENT REGARDING FEDERALLY SPONSORED RESEARCH OR DEVELOPMENT

Not applicable

REFERENCE TO SEQUENCE LISTING, A TABLE, OR A COMPUTER PROGRAM LISTING COMPACT DISK APPENDIX

Not applicable

BACKGROUND OF THE INVENTION

The invention concerns a fractional-N frequency synthesizer for generating high frequency signal at frequency that may be a non-integer multiple of the reference frequency. If it is necessary, this high frequency signal could also be modulated simultaneously to carry information.

Fractional-N frequency synthesizer is under intensive research for many years. It permits the synthesizer to use a reference signal with higher frequency to improve noise performance and lock-in speed. The main trade off is the introduction of the fractional spurs. Many techniques are invented to reduce the spurs level. One of the successful approaches is the Delta-Sigma noise shaping technique, which could significantly reduce the spurs level and bring the possibility to digitally add the phase or frequency modulation to the synthesized signal. However, for some application the improvement is not enough and the fractional spurs may still be a problem. Besides, significant portion of analog circuit is still needed which is also a limiting factor on the performance and the integration level.

The main analog circuit of a conventional synthesizer is the phase detector. The DSFD (Delta-Sigma Frequency Discriminator)[R. Douglas Beards and Miles A. Copeland, "An Oversampling Delta-Sigma Frequency Discriminator", IEEE Transactions on Circuits and Systems—II: Analog and Digital Signal Processing, Vol. 41, No. 1, Jan. 1994, pp.26–32] could be used to replace the phase detector in Fraction-N frequency synthesizers [U.S. Pat. No. 5,781,044] and modulators [W. T. Bax and M. A. Copeland, "A GMSK Modulator Using a Frequency Discriminator-Based Synthesizer", IEEE Journal of Solid-State Circuits, Vol. 36, No. 8, Aug. 2001, pp.1218–1227]. The DSFD has the function of a frequency discriminator with the unique feature that the detected signal is in digital format representing the Delta-Sigma quantization to the fractional frequency of the input signal. Thus the synthesizer could be formed by using digital signal processing to generate the control signal for the VCO (Voltage Controlled Oscillator), which may be more precise and flexible. So from functional aspect it is a device that digitally quantizes the phase or frequency difference to be measured. There are also other patented inventions with the similar functions (such as U.S. Pat. No. 6,107,890 etc.). This type of the detection is advantageous in the application where the digital signal processing is preferred, but most of the previous proposed structures have limitations on some of the performances such as resolution, accuracy or response time so that their application is also limited.

The first order DSFD shown in FIG. 1 is very attractive since it is formed with only a DMD (dual modulus frequency divider) (1) and a D flip-flop (2). However, the above mentioned invention and applications to use the DSFD always extract the error information from the outputted digital signal directly by calculating the difference between the average value of that signal and the desired fractional number for the signal frequency to be synthesized and then suppressing the fractional spurs by decimation and loop filtering. Mathematically this is correct according to the principal of Delta-Sigma modulation. But to use the first order DSFD in this way will result in very high fractional spurs since it only performs first order Delta-Sigma modulation. This is why the second or higher order DSFD is suggested and used in the reported implementations. The problem is that the structure of the higher order DSFD is much complicated and analog phase detector is used in the structure. So although the resulted synthesizer does contain more digital signal processing, its accuracy and noise performance are obviously questionable due to that more and complicated analog circuit is also used.

There are generally two ways for fractional-N synthesizers to reduce the fractional-N spurs. Besides the higher order Delta-Sigma noise shaping method, the more traditional way is to add the analog compensation signal to the synthesizer with the first order Delta-Sigma modulation. The compensation is possible because the fractional phase jitter has its own evolution rules. It is well known that the performance of such synthesizer could be very good, but is very sensitive to the precision of the analog circuit, which is subject to variations as a function of time and temperature.

It will be worthwhile to investigate whether it is possible to remove the fractional spurs generated by the first order DSFD using also the evolution rules of the fractional phase jitter. If this is possible and it is also performed by the pure digital signal processing that has no problem of analog mismatch, then the resulted synthesizer could be quite ideal: low fractional spurs and almost pure digital implementation. This is exactly what will be disclosed by this invention.

BRIEF SUMMARY OF THE INVENTION

The general idea of this invention is to provide a fractional-N synthesizer that uses first order DSFD to replace the phase detector for detecting phase and frequency error while digitally cancels the fractional spurs by using the evolution rules of the fractional phase jitter.

More specifically, the output bit stream from the DSFD is not used directly as the detected fractional frequency value, but it is compared bit-by-bit to another bit stream generated by an accumulator digitally performing the first order Delta-Sigma modulation to the desired fractional number for the signal frequency to be synthesized. Since DSFD is equivalent to doing the first order Delta-Sigma modulation to the fractional number of the output frequency, it is easy to image that in the locked condition the two bit streams will be almost the same. This means that the two bit streams contain almost same quantization noise pattern. By comparing these two bit stream and using suitable algorithm to only extract the error information carried by the small difference of the bit streams it is possible to cancel almost all the quantization noise in the bit stream.

Accordingly, one advantage of this method is that very high fractional spurs suppression could be achieved. In fact, the mathematical simulation shows that there are almost no conventional discrete spurs in the output spectrum. Even more ideally, the cancellation is done digitally so that will not be affected by any physical disturbance of the circuit.

One other advantage is that only VCO and DSFD works at the output frequency and the structure of first order DSFD is relatively simple, all other circuit could work at lower frequency and could be implemented digitally. This will make the circuit especially suitable to be used in integrated circuit. Also more importantly, it will be easier to control the non-ideal analog noise level in the circuit since the noise could only be induced by very few components. Therefore, it is possible to make the synthesizer with very good noise performance.

One other advantage is that the spurs canceling is done digitally and most of other signal processing could also be done digitally. So the invented structure is ideal for the applications requiring subsequent digital processing since it could provide very high detection resolution for the phase error not obtainable from any previously available pure digital phase detector. An application example is that it is easy to add modulation to the synthesized signal by digital means. If the modulation bandwidth is narrower than the loop bandwidth, the modulation could be applied to the spurs cancellation stage with the advantage that the loop feedback will also automatically maintain the modulation accuracy. If wideband modulation is needed then an additional modulation could be applied to the output of loop filter for directly modulate the VCO. There is no difficulty on gain and timing match of the modulations at different points since they are applied digitally. It is also possible to add the algorithm to automatically compensate the change of the VCO parameters if needed.

One other quite important advantage is on the cost of the synthesizer. As stated above, it is possible to make high performance synthesizer with simple high frequency circuit and highly integrated digital circuit (it is very probable that low cost CMOS technique could be used) with the advantage of digitally add the modulation, this invention is even more valuable to those applications require high performance and low cost simultaneously.

DETAILED DESCRIPTION OF THE INVENTION

It is useful to describe the DSFD in more detail for better understanding the present invention.

Figure 1:
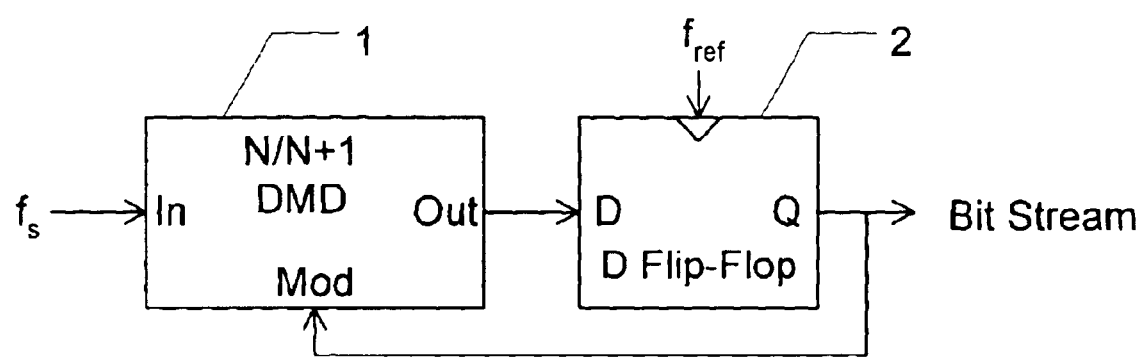
FIG. 1: The structure of the first order Delta-Sigma frequency discriminator.

Refer to FIG. 1, if the up-transition from the output of the DMD comes before the reference transition, the output bit will be 1 and the next dividing ratio of the DMD will be set to N+1. On the other hand, if the up-transition from DMD comes after the reference transition, the output bit will be 0 and the next dividing ratio will be N.

Assume $f_s$, the input frequency to the DSFD is:

$$f_s=(N+S)f_{ref} \quad 0<S<1 \qquad (1)$$

where N is a positive integer, S is a fractional number, and $f_{ref}$ is the reference frequency.

The formula could also be written as:

$$T_{ref}=(N+S)T_s \qquad (2)$$

in which $T_{ref}$ and $T_s$ are the cycle time for reference and input signal respectively.

Figure 2:
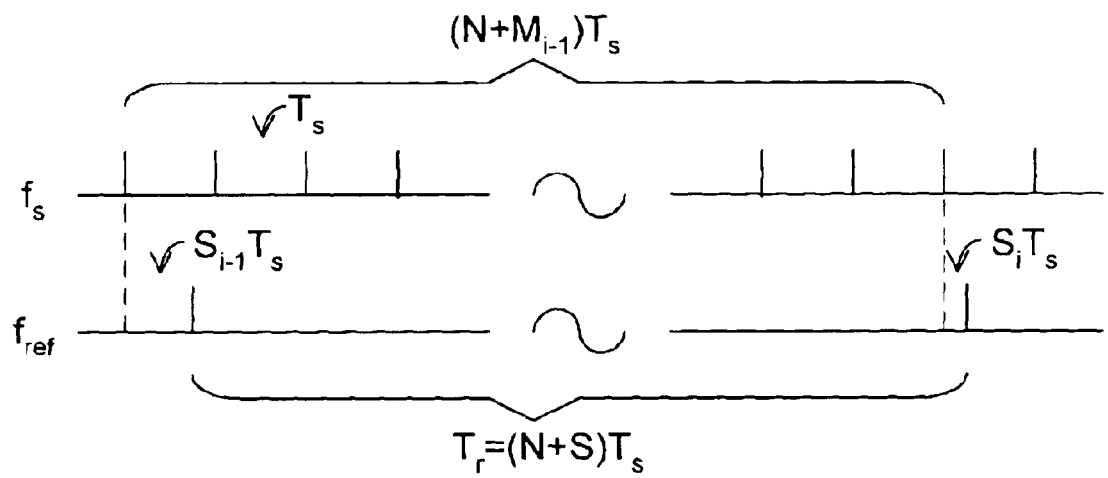
FIG. 2: The signal time diagram of the first order Delta-Sigma frequency discriminator.

FIG. 2 is the signal time diagram of the first order DSFD. Assume that at (i−1)'th reference transition the division ratio of the DMD is set to $N+M_{i-1}$ ($M_{i-1}$=0 or 1 which is the output bit of the DSFD). The sampling phase of the reference signal relative to the time when the DMD starts to count this $N+M_{i-1}$ cycles is assumed to be $S_{i-1}$ (Normalized with $T_s$, that is, $S_{i-1}$ equals the time difference between these two transitions divided by $T_s$). Note that in the stable state in which the initial transition mismatch between the DMD output and the reference signal is removed, $S_{i-1}$ should be less than 1. The initial mismatch could be removed by letting the DSFD runs for enough cycles or resetting the DMD at initial time. After the DMD has counted those $N+M_{i-1}$ cycles, the i'th sampling phase will be:

$$S_i=S_{i-1}+(N+S)-(N+M_{i-1})=S_{i-1}+S-M_{i-1} \qquad (3)$$

If $S_i>0$, then the reference transition will come after the DMD output transition, so $M_i$=1. Similarly, if $S_i<0$ the DMD output transition will come after the reference transition, then $M_i$=0.

Expression (3) is the function of first order Delta-Sigma accumulator. Note that the sampling phase $S_i$ is quantized at zero. According to the Delta-Sigma modulation theory, the bit stream $\{M_i\}$ is then the first order one bit Delta-Sigma modulation to the fractional number S. That is, the average value of $\{M_i\}$ will equal to S, so it could be considered as a digital value that is proportional to the fractional number of the input frequency $f_s$. This is why the structure is named as the Delta-Sigma Frequency Discriminator.

Figure 3:
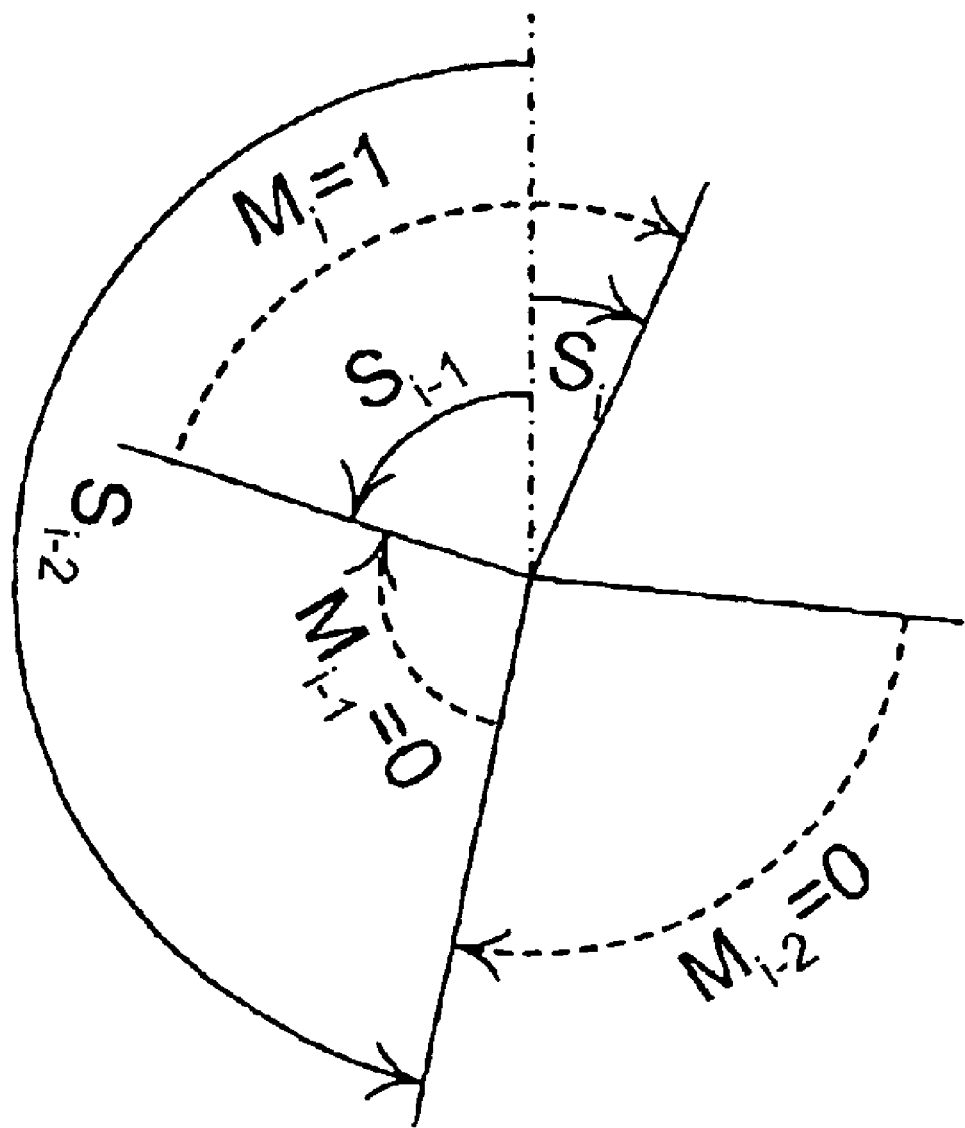
FIG. 3: The graphical explanation to the first order Delta-Sigma difference equation.

Expression (3) could be better described graphically in FIG. 3. In the figure the polar angle of the solid radial state lines relative to the dot-dashed vertical reference line is the sampling phase $S_i$ multiplied by $2\pi$. Notice that the factor $2\pi$ is omitted in the figure and in all of following discussions for simplicity, that is, all the angle value must be multiplied by $2\pi$ to get the actual angle value. For each reference period, the state line will turn clockwise an angle of S. If the line doesn't pass the reference line, the corresponding output bit $M_i$ will be 0, and otherwise will be 1. Since the position of a line will not change by subtracting 1 (actual angle is $2\pi$) from its polar angle, the rotation of the state line will not be disturbed by the value of $M_{i-1}$ in (3). Thus the change of the sampling phase $S_i$ could be represented by a clock hand that is rotating around the circle and at each reference transition time the clock hand will be at the position of corresponding state line.

Assume S=n/m in which n and m are relatively prime to each other. If the clock hand starts from the reference line, it will turn n circles in m reference cycles and be at the reference line again. The position of state lines for every reference time will be different to each other, so that the m state lines will be evenly distributed along the circle which means that the angle between two adjacent state lines will be 1/m.

It must be noted that the DMD in FIG. 1 has two division moduli of N and N+1 and all the following discussion is based on this assumption. In fact, it is possible to use a DMD with other couple of division moduli that is separated by more than 1. The working principal is the same and the change on the calculations and implementations could be derived accordingly.

Figure 4:
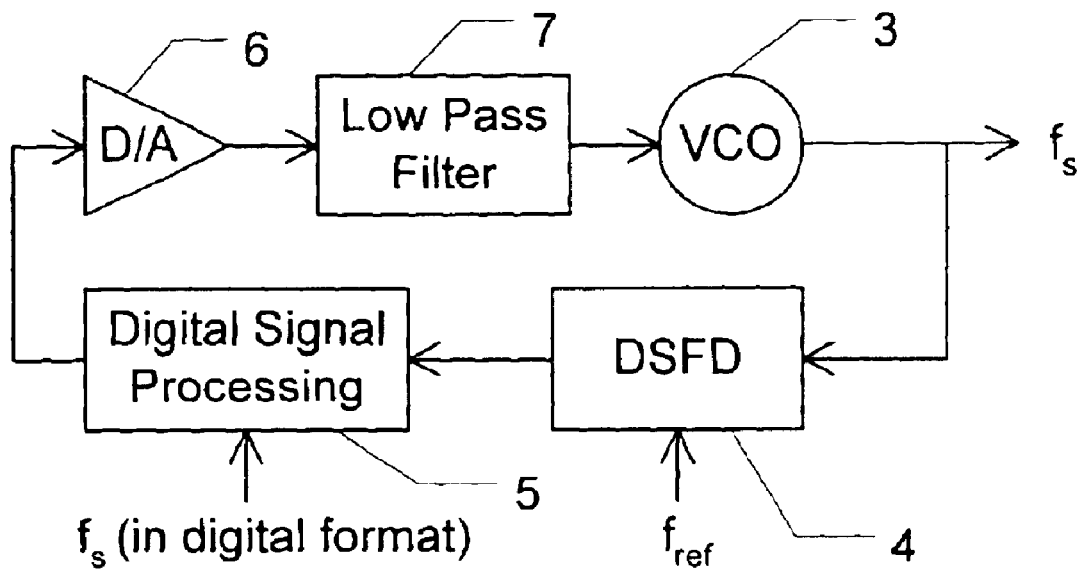
FIG. 4: One possible implementation of frequency synthesizers using Delta-Sigma frequency discriminator.

FIG. 4 shows one possible implementation of frequency synthesizers using DSFD. The DSFD (4) will generate a bit stream that is the first order one bit Delta-Sigma modulation to the fractional number of the VCO (Voltage Controlled Oscillator) (3) frequency with respect to the reference frequency. The digital signal processing block (5) will process the bit-stream received from the DSFD together with the required output signal frequency $f_s$ to generate a feedback error signal. It then performs necessary filtering to the signal to form suitable loop transfer function. The result will be sent to a D/A (Digital to Analog Converter) (6) to generate the analogue control voltage for the VCO. The low pass filter (7) will only remove the high order sampling harmonics of the D/A and has very small effect on the loop transfer function design.

If according to the way used by the above mentioned previous invention and applications with the DSFD the digital signal processing block will derive the desired fractional number S from the frequency $f_s$ and the reference frequency $f_{ref}$, and then calculating directly the difference between S and the output bit stream from DSFD as the feedback error signal. It is obvious that no matter whether the calculation is performed before or after the bit stream is decimated or averaged, the spurs level of the synthesizer is mainly determined by the order of the Delta-Sigma modulation performed by the DSFD. The mathematical simulation shows that if the error signal is generated in this way the spurs level for the first order DSFD with reasonable loop parameters will be unacceptable high for most applications.

Figure 5:
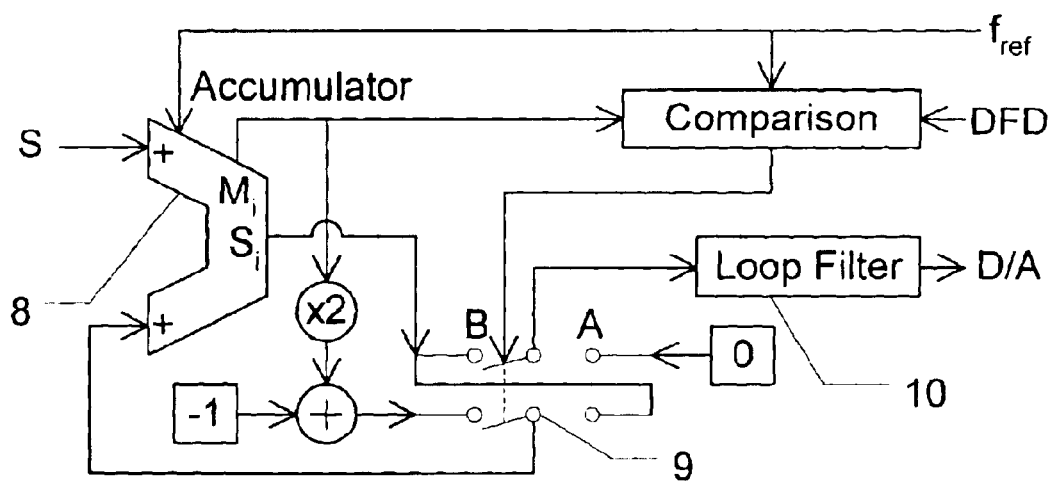
FIG. 5: One possible detailed implementation of the digital signal processing block according to the invention.

FIG. 5 is one possible detailed implementation of the digital signal processing block according to this invention. The block will not calculate directly the difference between fractional number S and the output bit stream from DSFD. It has an accumulator (8) digitally performing the first order Delta-Sigma modulation with the fraction number S. The feedback error signal will then be generated indirectly by comparing the bit stream from the accumulator to the bit stream from the DSFD.

The working sequence of the block is as follows. At i'th reference cycle the accumulator sums its two inputs and subtracts the sum by $M_{i-1}$ to get its next sampling phase $S_i$. If $S_i$ is larger than zero $M_i$ will be set to 1, otherwise 0. $M_i$ is then compared with the output bit from the DSFD. The comparison result is used to control the feedback error signal generating and the feedback to the accumulator by using the 2×2 switch (9). If the two comparing bits are the same, then the switch will be set to position A, the error signal sent to the loop filter (10) will be 0 and $S_i$ is sent back to the accumulator as the feedback input for next cycle. If the two comparing bits are not the same, the switch will be set to position B, $S_i$ will be sent as the error signal and $2M_{i-1}$ will be sent back to the accumulator as its feedback input for next cycle.

The working principal of this algorithm could be better explained by using the graphic notation in FIG. 3. It is obvious that the sampling phase $S_i$ of the accumulator could be represented by a clock hand with a constant rotation speed defined by the fractional number S. So this clock hand represents a precise reference signal running at the desired output frequency of the synthesizer. The sampling phase in the DSFD related to VCO output could be represented by another clock hand of which the rotation speed will be affected by noise and VCO control voltage. Thus the phase error of the synthesizer could be graphically represented by the angle difference between these two clock hands.

Since the output from the DSFD is only a bit stream of representing whether its clock hands has passed the reference line during that reference period, there is no way to exactly measure the angle difference between these two clock hands. However, by comparing the two bit streams generated by the two hands it is still possible to extract a lot of information about the phase error. If the two clock hands both pass or both not pass the reference line, which is indicated by the two same comparing bits, the only thing could be known about the angle difference between them is that the difference may probably be very small. The more useful information about the phase error could be known in two cases. The first case is that only one clock hand has passed the reference line during a reference cycle, so that the two hands will be at the different side of the reference line by that reference time. Since the angle of the state line for the accumulator hand is known (which is in fact the present sampling phase of the accumulator), so in addition to the sign of the phase error, the magnitude of the phase error is know to be larger than the angle of that state line.

The second case detection event is that the accumulator hands is on the reference line, the sign of the phase error could be determined by whether the DSFD hand has passed the reference line or not, but without the magnitude information.

The algorithm shown in FIG. 5 uses the first case detection event to generate the feedback control signal. The ideal feedback error signal is the change of the angle between the two clock hands during one reference period, which is the instantaneous frequency difference between the two signals. If the two comparing bits are the same, as stated above that the angle difference may probably be small, the error signal is sent as zero. Once the first case detection event is trigged by the two different comparing bits, the angle of the state line where the accumulator hand stays will be outputted as the error signal. If the error detection is precise, after the error signal is generated the accumulator hand need to be restarted at the position of DSFD hand so that the detection in the following reference cycle will only detect the change of the angle between the two clock hands during those cycles and not include the above detected error signal. In fact, this is equivalent to rotate the accumulator hand with an angle shift that is equal to the error signal towards the DSFD hand. But since the detected error signal is not exactly equal to the angle between the two clock hands, the accumulator hands cannot be restart at the same position where the DSFD hand is. It is only possible to rotate the accumulator hand with the angle of generated error signal, so that for the detection in the following cycle there will be an initial angle difference that equals the chase error not been detected between the two clock hands. Fortunately, this is also the best way to restarting the accumulator hand. This is because that in the following operations if the angle difference has evolved large enough to trig another first case detection event, the contribution of that extra angle difference not been detected in the previous reference cycle will be eventually included. From the view of graphic notation, the accumulator hand will follow the DSFD hand closely as the result of the rotation after each error signal generation. As long as the two clock hands follow each other closely, the undetected chase error will always be very small and all the phase error evolved will be finally detected. Therefore, there will be only some delay to a small part of the phase error in the detection. If the delay is much less than the reciprocal of the loop bandwidth, the performance penalty cause by the delay will be acceptable.

The gain of the frequency discriminator defined in this way is unit since the angle of the state lines has the same unit as the fractional number S and the actual frequency is proportional to S by a factor of $f_{ref}$, so the change of the angle between two clock hands detected in one reference cycle equals the actual frequency difference between the two signals represented by the clock hands.

Restarting the accumulator hand is performed in FIG. 5 by sending $2M_{i-1}$ back to the accumulator after the nonzero error is detected. The next sampling phase of the accumulator will be:

$$S_{i+1}=2M_i-1+S-M_i=M_i-1+S \quad (4)$$

Note that the output bit of the DSFD for the i'th reference cycle is different from that of the accumulator in the first case detection event, so if the variables of the VCO hand are denoted by apostrophes and it is rotating at the same speed as the accumulator hand, the next sampling phase of the VCO hand will be:

$$S'_{i+1}=S'_i+S-M'_i=S'_i+M_i-1+S \quad (5)$$

Thus the difference of the two sampling phases is changed from $S_i-S'_i$ to $-S'_i$, which is really the extra angle difference that is not been detected.

It must be noted that the switch (9) will also act on some of second case detection event which is depending on what bit, 0 or 1, will be defined to be the accumulator output when the sampling phase of the accumulator is 0. However, the switch will have no effect on the detection. This is because that even the switch will act due to the different comparing bits, the error signal will be zero anyway since at this time $S_i$ is zero. The difference of the two sampling phases will also not change as long as the accumulator is restarted by sending back $2M_i-1$ means that the second case detection event has no effect on the error detection.

Since the generated error signal only contains 0 and the sampling phase of the accumulator, which should be much less than 1 if the loop is locked, the quantization noise is much lower than that in the output bit stream of the DSFD. Therefore, the comparison of the two bit streams really cancels most of the quantization noise.

The main limitations for this kind of synthesizer are that the minimum detectable phase error is 1/m and approximately m reference cycles are needed to get one nonzero detection in the locked state.

Requiring m reference cycles to get one nonzero detection means that the loop must work on a reference frequency much higher than the conventional loop with the same loop bandwidth. This is the cost must be paid to eliminate the analog phase detector. It is similar to the cost paid for the Delta-Sigma modulation technique in other applications. This cost is compensated by the ability to greatly increase the reference clock in a purely digital integrated circuit which could be made with very low cost.

1/m is the angle of the state line nearest to the reference line. If the phase angle between the two clock hands is smaller than this value, the detected error signal will always be zero. Thus the minimal range of the phase error in the synthesizer is about ±1/m.

Principally, this limitation comes from the intrinsic detection property of the DSFD, that is, if the phase error is smaller than 1/m, in most situation the DSFD will generates a bit stream that is exact the same as what will be generated with no phase error. Even the error signal is generated directly from the output bit stream this limitation cannot be avoided also.

However, the above algorithm only reacts on the first case detection event. The information delivered by the second case event is not utilized. It should be possible to reduce the above limitations if the second case event could also contribute to the error detection.

The condition for the second case detection event to happen is that after a first case event the phase error is controlled to be smaller than ±1/m continuously for more than m reference cycle time. Since no other first case event will happen due to the small phase error, the accumulator hand will not be restarted, so it will return to the reference line for every m reference clock cycles.

Although no magnitude information of the phase error could be got in this event, it provides the information about the sign of the phase error. Assume that the output bit from DSFD when the accumulator hand starts from the reference line is $M'_i$ and at next second case event is $M'_{i+m}$. If $M'_i=M'_{i+m}$ then no information could be known for the phase error generated during this period. But if $M'_i \neq M'_{i+m}$ then whether the rotation speed of VCO hand is faster or slower than the accumulator hand is known. $M'_{j+m}=1$ means faster while $M'_{j+m}=0$ means slower. So a perturbation signal with suitable sign could be applied as the feedback error signal to change the speed of the VCO hand in the opposite direction.

If the perturbation signal is strong enough so that the rotation speed of the VCO hand is over compensated, the angle difference between the two clock hands will continues to decrease. Finally, the two clock hands will meet and after that the angle difference will increase again. The output bit of DSFD at the second case detection event following the meeting of the clock hands will also change. If another perturbation signal that has opposite sign with the previous one is sent to the loop filter after the above change is detected, the rotation speed displacement of the VCO hand will be turned back to make angle difference decreasing again.

Thus one possible way to do the control is to generate a perturbation signal with a fixed amplitude and opposite sign in turn according to the information given by the second case detection event. In this way the angle difference between the two clock hands could be kept in a small range.

The condition for this process to continue is that the random rotation speed fluctuation of the VCO hand (that is, the phase noise that the synthesizer is going to suppress) is less strong than the propelling generated by the perturbation signal, so that the VCO hand will finally meet the accumulator hand after the applying of the perturbation.

Therefore, from the stability consideration, it is preferred to generate the error signal with a large magnitude. However, this will also increase the range of VCO hand drifting around the accumulator hand. The effectiveness of such perturbation will be completely lost if the drifting range is larger than ±1/m. Since the smallest error signal generated by the first case detection is 1/m, it is reasonable to choose the magnitude of the perturbation between 0 and 1/m.

If the random rotation speed fluctuation of the VCO hand is so strong that the two clock hands will not meet after a perturbation error signal is applied, but their angle difference increases to larger than 1/m, then another first case detection event could be trigged again. If the system remember the total perturbation applied since the last first case event, then an error signal which is the difference between the first case detection signal (the content of the accumulator) and the total perturbation applied could be generated. This will make the first case event feedback functioning as no perturbation from the second case event has been applied. Then after the VCO hand is brought close to the accumulator hand again by the first case detection, the second case detection could function again.

Generally, it is possible to halve the average phase error by introducing the second case detection event perturbation. If sufficient high reference frequency could be used, it is even possible to reduce the average error further more by using a smaller perturbation signal. This will make the synthesizer could also have good phase error performance on some S value that has small non-reducible denominator value m.

Figure 6:
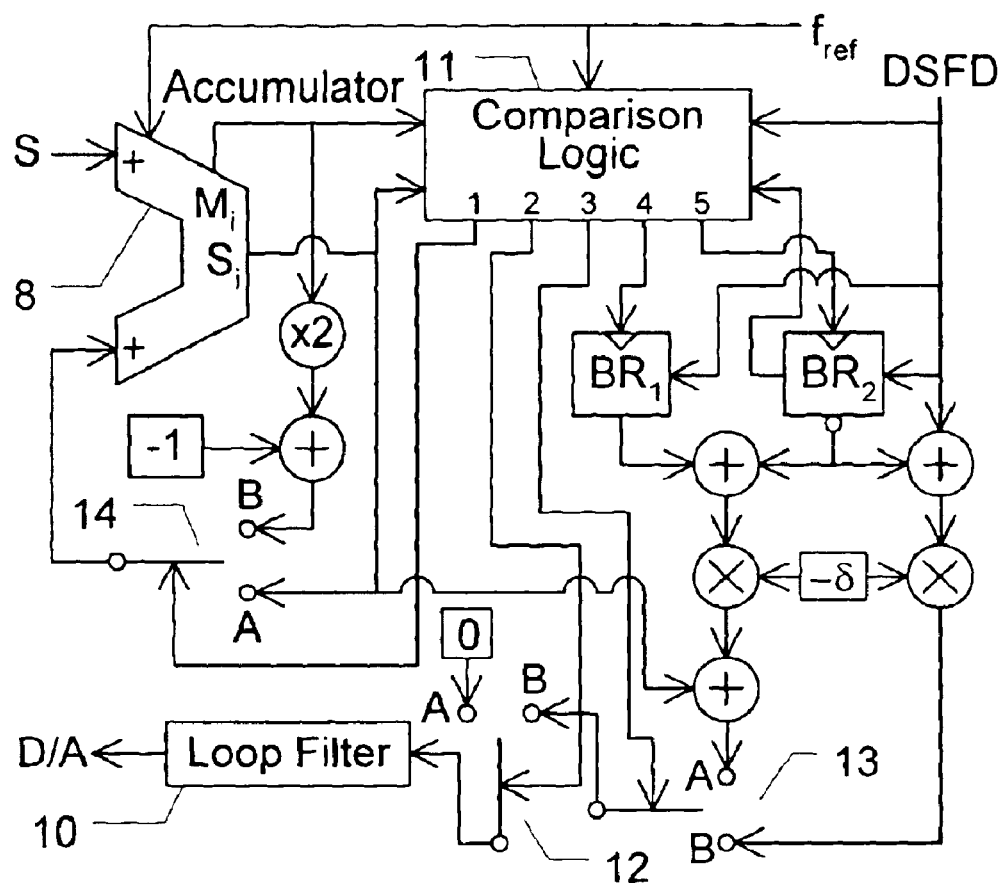
FIG. 6: One possible implementation of the signal processing block including the second case detection event perturbation.

FIG. 6 is one possible implementation of the signal processing block including the second case detection event perturbation.

The accumulator (8) is working in the same manner as in the first case only detection. The comparison logic unit (11) will generate a control signal on its port 1 to change the switch (14) from position A to B when the two comparing bits from the accumulator and DSFD is different. Switch (12) will stay at position A if neither event is happening. When either event occurs (the two comparing bits is different and $S_i \neq 0$ for the first case, or $S_i = 0$ for the second case) it will be switched to position B. Switch (13) will be at position A for the first case and position B for the second case. The two bit registers $BR_1$ and $BR_2$ are used to record the perturbation history for the second case event and are set to same value at the initialization.

When the first case detection event happens, switch (13) is at position A, and the values in $BR_1$ and $BR_2$ cancel each other so that the error signal sent to the loop filter (10) is the sampling phase of the accumulator as required.

After the error signal is sent to the loop filter, the comparison logic unit will generate a control signal on its port 4 and 5 to latch the present output bit from DSFD into both $BR_1$ and $BR_2$. Thus if the following is another first case detection event, the value of $BR_1$ and $BR_2$ will continuously have no effect on the detected error signal. $BR_2$ may be independently changed in a second case event. That is, if the comparison logic has detected in a second case event that the present DSFD output bit is different from $BR_2$ it will generate a control signal on port 5 to latch that bit into $BR_2$ after the error signal has been sent to the loop filter. The perturbation signal in the second case event will be calculated from the value of BR2 and the present DSFD output bit together with the perturbation magnitude δ and will be sent to the position B of switch (13).

If a first case detection event is trigged after several second case events, the value of the error signal will be affected by the perturbation history. The sum of all perturbation signal applied will be calculated from $BR_1$, $BR_2$ and δ which will then combined with the sampling phase of the accumulator to form the error signal for this first case event.

It must be noted that the above algorithms are not the only implementations of the invention and could still be optimized for specific applications. For example, if an error signal slightly larger in absolute magnitude than the sampling phase of the accumulator is generated in the first case detection event and then restart the accumulator by rotating its hand with this larger angle, the algorithm is a little more complicated but a better performance could be achieved. This is because now the error detection is not always delayed detection and some time the phase error is overestimated. By properly choosing the overshooting error signal magnitude it is possible to statistically balance the delay and the overshooting to achieve better phase error performance.

One of the flexibility of using DSFD is that it is possible to form both FLL (Frequency-Locked-Loop) and PLL (Phase-Locked-Loop). The structural difference of PLL from FLL using DSFD is that an additional integral stage at the loop filter input port is needed to change the detected frequency error to phase error. FLL could have better transient response than that of PLL. It is generally considered that the phase noise performance of the PLL is better than FLL, however, it may not be true for the synthesizer of using DSFD due to the difference on the structure. In some applications FLL could have better suppression to some noises than the PLL.

One other flexibility is that the digital signal processing is used in most parts of the loop. This makes changing the loop bandwidth easier during the operation. So that it is possible to use a large loop bandwidth at the lock-in stage to greatly reduce the locking time and then switch to a narrower bandwidth during the normal operation to get higher performance. The lock-in time could also be reduced by forming the loop during the lock-in stage as a FLL that has a good transient response than that of the PLL.

One of most important flexibility of the invented structure is the ability to add the frequency or phase modulation to the synthesized high frequency carrier. To do this, no change needs to be made to the high frequency circuit and only the signal processing block needs to be modified. The required frequency deviation $\Delta f_m$ for the modulation is added to the block as an input. To perform phase modulation, it is needed to differentiate the phase signal to get the frequency deviation.

If the loop bandwidth is larger than the modulation bandwidth, the frequency deviation that is normalized by the reference frequency could be simply combined with the fractional number S and sent to the accumulator. This is a type of one point modulation method and its working principal is the same as that of the conventional modulation loop, except with the advantage of digital implementation. The main limitation for this method is that at reasonable reference frequency often the loop bandwidth cannot be wide enough due to the phase error detection mechanism. Fortunately, the structure is especially suitable for using the method of two points modulation to increase the modulation bandwidth.

Figure 7:
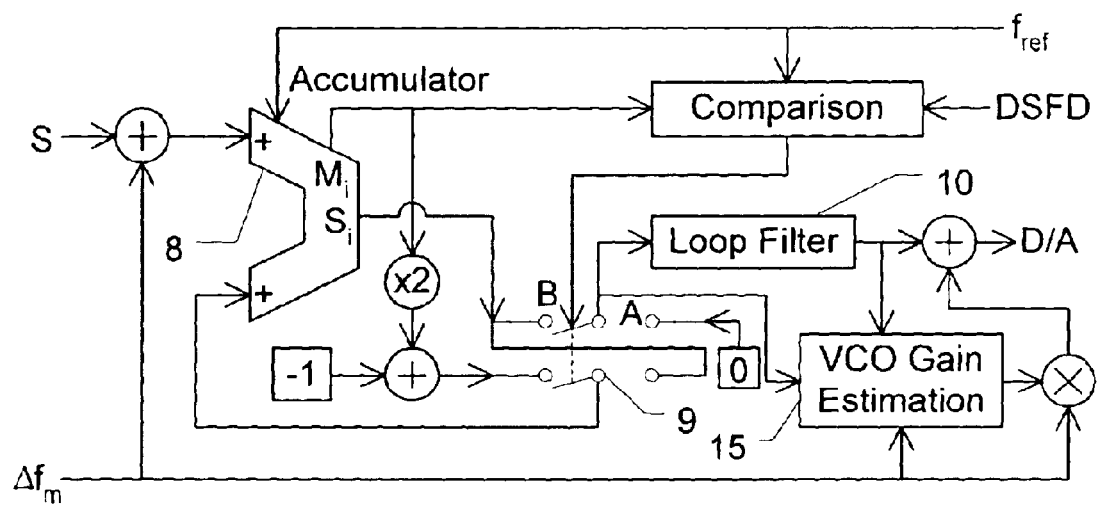
FIG. 7: One possible implementation of the two points wideband modulation.

FIG. 7 is one possible implementation of the two points wideband modulation. For simplicity, only first case detection event is used. The modulation signal added to the inputs of the accumulator is the same as that in the one point modulation mentioned previously. Besides, the modulation signal is also combined with the output from the loop filter and applied to the D/A directly. Since this signal is applied after the loop filter, the modulation frequency applied on VCO could be very high. Note that the modulation applied to the accumulator will make the equivalent comparing signal also contains the required modulation. Thus if the modulation on the VCO is correct, no bit mismatch in the bit streams comparison will be caused by the modulation. This means that the interference between the modulation and the phase error sampling is minimized, which is beneficial for achieving high modulation accuracy.

The definition for the second case detection event in the modulation will be different. In many cases the modulation itself acts as a perturbation to improve the phase error without the second case detection event perturbation. However, the above described principal of perturbation could still be used with modifications to reduce the phase error if it is needed.

The magnitude of the modulation signal applied directly to the VCO should be properly normalized with respect to the VCO modulation gain that needs to be calibrated. This could be done before the data burst transmission. The calibration process could be done by several ways. If the modulation amplitude is small then a low frequency scanning modulation could be applied to the modulation point to the accumulator and then check the output of the loop filter generated by the loop feedback to calculate the VCO gain. If the modulation amplitude is large and the scanning method is too slow, then the calibration could be done by locking the loop at several calibration frequency points while the calibration time could be reduced by switching the loop bandwidth and formation.

From modulation accuracy aspect, two points modulation is preferred than the one point modulation with pre-distortion to compensate for the narrow loop bandwidth. This is because that one more modulation point only brings a minimal hardware change to the circuit in the pure digital implementation, but the distortion caused by the sampling mechanism of loop feedback comparison could be avoided. The distortion to the modulation caused by VCO gain change is almost the same for either two points or pre-distortion methods.

If the length of the data burst is very long, then the changing of the VCO modulation gain coefficient with time needs to be compensated. FIG. 7 has included a possible compensation method. Assume the modulation transfer function of the VCO is linear, so its output frequency $f_{vco}$ is determined from the input voltage $V_{in}$ by two parameters: modulation gain coefficient $K_{vco}$ and base frequency $f_0$.

$$f_{vco} = K_{vco} V_{in} + f_0 \qquad (6)$$

The change on $K_{vco}$ will cause the bit comparison to output feedback error signal proportional to $V_{in}$ which contains the modulation component of $\Delta f_m$. If the reference frequency is sufficient high so that the modulation component $\Delta f_m$ is not completed lost in the sampling process, then the change on $K_{vco}$ could be detected by estimating the magnitude of modulation component $\Delta f_m$ in the error signal which is done by the VCO gain estimation block (15) that will also generate the multiplication coefficient to the frequency deviation signal by using the estimated VCO gain. Often the changing rate of the VCO gain is very slow, so the bandwidth of correction feedback could be very small which makes the high precision compensation possible.

One other possible algorithm to track the change of VCO gain is to perform a high pass filtering to the modulation signal applied directly to the VCO. Since the correct modulation is applied to the accumulator, the loop feedback will then be forced to compensate the missing low frequency component of the modulation from the loop filter. Thus the change of the VCO gain could be obtained by measuring the amplitude of the low frequency component of the modulation at the output of the loop filter. The requirement for this algorithm is that the modulation should contain enough low frequency components.

Generally, the invention has provided a method for generating feedback error signal in fractional-N frequency synthesizer with very simple circuit but yield excellent spurs and phase error performance. It provided the possibility for maximally digital implementation; however, analog circuit such as loop filter could also be used depending on the requirement. Based on this invention and using fully developed digital signal processing and synthesizer techniques there are many possible ways to implement the invention for specific applications and will be claimed to be within the scope of the this invention.

What I claim as my invention is:

1. A fractional-N frequency synthesizer for generating the high frequency signal at frequency that may be a non-integer multiple of the frequency of the reference signal, having a voltage controlled oscillator (3) the output of which is fed to a first order Delta-Sigma frequency discriminator (4) having a dual modulus frequency divider (1) and a D flip-flop (2), where a bit stream related to the frequency and phase of said voltage controlled oscillator is generated by using said reference signal and is then processed to generate a feedback error signal by using the information provided by comparing said bit stream with a bit stream generated by an accumulator digitally performing the first order Delta-Sigma modulation to the desired fractional number for the controlling of said voltage controlled oscillator after the said feedback error signal is properly filtered, amplified and converted, which will maximally suppress the fractional spurs due to the frequency quantization of said Delta-Sigma frequency discriminator.

2. A frequency synthesizer according to claim 1 wherein said fractional number and said reference frequency is chosen with the help of design principle that non-reducible denominator of said fractional number has a close relation with the phase error performance of the synthesizer.

3. A frequency synthesizer according to claim 1 wherein a feedback error signal representing the frequency error of said voltage controlled oscillator is generated when the comparing bits is different by using the information provided by the present sampling phase of the accumulator (8) on the lower limit of the phase difference generated by the said frequency error, and the same value as that of the said feedback error signal will be used as the rotating angle to restart said accumulate (8) after the error signal generation so that the detected phase error generated by the frequency error of said voltage controlled oscillator will not interfere, and the undetected phase error will be kept, for the error detection in the following detection cycles.

4. A frequency synthesizer according to claim 3 wherein said feedback error signal is set to 0 if the two comparing bits from said bit streams equal in value, and is set to the sampling phase of said accumulator if the two comparing bits from said bit streams not equal in value while said accumulator will be restarted by sending 2 times its present output bit minus 1 to its feedback input for the operation of next reference cycle.

5. A frequency synthesizer according to claim 4 wherein said feedback error signal contains a small perturbation signal applied according to the change of the output bit of said Delta-Sigma frequency discriminator on the cycle that the sampling phase of said accumulator is 0 with fixed amplitude but proper sign so that the phase error of said voltage controlled oscillator is confined to a small range.

6. A frequency synthesizer according to claim 5 wherein the sum of all the perturbation signal applied after the last time to send the sampling phase of said accumulator as the feedback signal and subsequently restart said accumulator will be subtracted from the sampling phase of said accumulator if its sampling phase will be sent as the feedback error signal for this reference cycle, so that the loop could seamlessly switch back to the operation mode with no perturbations.

7. A frequency synthesizer according to claim 1 wherein said feedback error signal is filtered by a digital loop filter (10) for getting the required loop transfer function and subsequently converted by a digital to analog converter (6) to an analogue control voltage that will be fed back via an analogue low pass filter (7) to said voltage controlled oscillator for controlling its frequency.

8. A frequency synthesizer according to claim 7 wherein said loop filter has an additional integrator that will form the synthesizer using said Delta-Sigma frequency discriminator as a phase-locked-loop.

9. A frequency synthesizer according to claim 7 wherein the synthesizer is formed to be a frequency-locked-loop in order to optimize its noise performance and transient response characteristics for a specific application.

10. A frequency synthesizer according to claim 7 wherein that its loop bandwidth and the loop formation as a phase-locked-loop or frequency-locked-loop could be dynamically changed during the operation with the help of digital implementation to get fast lock-in time at the start up and high performance in normal working stage.

11. A frequency or phase modulator that is based on the frequency synthesizer according to claim 1 wherein a modulation signal in the format of normalized frequency deviation is combined with said fractional number S and sent to said accumulator to perform the modulation.

12. A frequency or phase modulator according to claim 11 wherein said modulation signal in the format of frequency deviation is also combined with the output from said loop filter to perform two points wideband modulation.

13. A frequency or phase modulator according to claim 12 wherein that the gain of said voltage controlled oscillator is calibrated by using a low frequency scanning modulation applied to the modulation point to the accumulator and then check the output of the loop filter generated by the loop feedback.

14. A frequency or phase modulator according to claim 12 wherein that the gain of said voltage controlled oscillator is calibrated by locking the loop to several frequency points and checking the output of the loop filter generated by the loop feedback for these frequencies, while the calibration time could be reduced by switching the loop bandwidth or formation.

15. A frequency or phase modulator according to claim 12 that the change on the gain of said voltage controlled oscillator could be estimated and compensated during the normal operation by estimating the magnitude of modulation component in the feedback error signal.

16. A frequency or phase modulator according to claim 12 that the change on the gain of said voltage controlled oscillator could be estimated and compensated during the normal operation by performing a high pass filtering to the modulation signal combined with the output from said loop filter and measuring the amplitude of the low frequency component provided by the loop feedback mechanism from said loop filter to cancellation the effect of said high pass filtering.

17. A frequency synthesizer or modulator has the working principal according to claim 1 wherein said dual modulus frequency divider used in said Delta-Sigma frequency discriminator has two division moduli that is separated by more than one.

18. A frequency synthesizer or modulator has the working principal according to claim 1 wherein said Delta-Sigma frequency discriminator has a reset circuit to remove the initial phase mismatch between said DMD output and said reference signal.

* * * * *